(12) United States Patent
Zhang et al.

(10) Patent No.: US 10,295,878 B2
(45) Date of Patent: May 21, 2019

(54) ARRAY SUBSTRATE AND LIQUID CRYSTAL DISPLAY PANEL

(71) Applicant: Wuhan China Star Optoelectronics Technology Co., Ltd., Wuhan, Hubei (CN)

(72) Inventors: Qipei Zhang, Guangdong (CN); Caiqin Chen, Guangdong (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 216 days.

(21) Appl. No.: 15/128,394

(22) PCT Filed: Sep. 6, 2016

(86) PCT No.: PCT/CN2016/098171
§ 371 (c)(1),
(2) Date: Sep. 22, 2016

(87) PCT Pub. No.: WO2018/028013
PCT Pub. Date: Feb. 15, 2018

(65) Prior Publication Data
US 2018/0217428 A1     Aug. 2, 2018

(30) Foreign Application Priority Data

Aug. 8, 2016   (CN) .......................... 2016 1 0643307

(51) Int. Cl.
*G02F 1/1333*     (2006.01)
*G02F 1/1368*     (2006.01)
(Continued)

(52) U.S. Cl.
CPC ........ *G02F 1/1368* (2013.01); *G02F 1/13338* (2013.01); *G02F 1/13394* (2013.01);
(Continued)

(58) Field of Classification Search
CPC ............. G02F 1/134363; G02F 1/1368; G02F 1/133345; G02F 1/13338; G02F 1/133514;
(Continued)

(56) References Cited

U.S. PATENT DOCUMENTS 10,811,981         10/2004  Hwang et al.
2003/0043307 A1     3/2003  Nakayama et al.
(Continued)

FOREIGN PATENT DOCUMENTS

| CN | 202141876 U | 2/2012 |
| CN | 204269996 U | 4/2015 |
| CN | 105487718 A | 4/2016 |

*Primary Examiner* — Charles S Chang
(74) *Attorney, Agent, or Firm* — Andrew C. Cheng

(57) ABSTRACT

The present disclosure discloses an array substrate and a liquid crystal display panel. The thin film transistors are arranged matrix on the array substrate, a first passivation layer is arranged on the source/drain electrode of the thin film transistors, an organic transparent layer is arranged on the first passivation layer and is located in an area other than the area of the thin film transistors and the area between the adjacent two thin film transistors, post spacers are arranged on the surface of the array substrate, and is located between any two of the thin film transistors. By way of the above, the present disclosure can prevent the PS sliding in the hole of the organic transparent layer, it is possible to increase the stability of the PS.

18 Claims, 2 Drawing Sheets

(51) Int. Cl.
  *G02F 1/1335* (2006.01)
  *G02F 1/1339* (2006.01)
  *G02F 1/1343* (2006.01)
  *G02F 1/1362* (2006.01)
  *H01L 27/12* (2006.01)

(52) U.S. Cl.
  CPC .... *G02F 1/13439* (2013.01); *G02F 1/133345* (2013.01); *G02F 1/133514* (2013.01); *G02F 1/136213* (2013.01); *G02F 1/136227* (2013.01); *G02F 1/136286* (2013.01); *H01L 27/124* (2013.01); *H01L 27/1248* (2013.01); *H01L 27/1255* (2013.01); *G02F 2202/104* (2013.01)

(58) Field of Classification Search
  CPC ............. G02F 1/13394; G02F 1/13439; G02F 1/136213; G02F 1/136227; G02F 1/136286; G02F 2202/104; H01L 27/124; H01L 27/1248; H01L 27/125
  See application file for complete search history.

(56) References Cited

U.S. PATENT DOCUMENTS

| | | | |
|---|---|---|---|
| 2004/0141142 A1 | 7/2004 | Choi et al. | |
| 2004/0196421 A1 | 10/2004 | Hwang | |
| 2008/0316419 A1 | 12/2008 | Choi et al. | |
| 2014/0009711 A1* | 1/2014 | Tomioka | G02F 1/134363 349/43 |
| 2017/0222059 A1 | 8/2017 | Chen et al. | |
| 2017/0329444 A1* | 11/2017 | Hwang | G06F 3/0412 |

* cited by examiner

ARRAY SUBSTRATE AND LIQUID CRYSTAL DISPLAY PANEL

FIELD OF THE DISCLOSURE

The present disclosure relates to a liquid crystal display technology field, and more particularly to an array substrate and a liquid crystal display panel.

BACKGROUND OF THE DISCLOSURE

With the demand of the liquid crystal panel, high aperture ratio and high resolution (Pixel Per Inch, PPI) became the important goals of the panel design. With the higher PPI, the pixel size is smaller. Due to the height of the post spacer (PS), whether it is photo alignment or rubbing alignment, the height makes the alignment with some blind area, therefore the bottom of the PS needs to use the black matrix (BM) to block the dark line caused the liquid crystal disorder by the poor alignment. Thus, as should not affect the aperture ratio, the position of the PS in the Pixel is very critical. Generally, we choose the PS standing in the middle of two thin film transistors (TFT), refer to FIG. 1, the PS 11 is arranged between the two holes of the organic transparent insulating layer (PLN) 12. The bottom of PS 11 is blocked by the BM 13, the bottom of the data line 14 is also blocked by the BM 13. In the generally design, after group the TFT and the CF, since the pixel size is small to allow narrowing the range of the precision to the group, the PS is easily to slide in the left and right sides of the PLN hole, resulting in PS ratio too small, insufficient support and related adverse. In FIG. 2, although move up the PS 11 may avoid the hole of the PLN 12, the bottom of the PS 11 in the dashed box 15 is also blocked by the BM 13, losing the aperture ratio.

SUMMARY OF THE DISCLOSURE

The embodiment of the present disclosure provides an array substrate and a liquid crystal display panel, can prevent the PS sliding in the hole of the organic transparent layer, it is possible to increase the stability of the PS.

The present disclosure provides an array substrate, thin film transistors are arranged matrix on the array substrate, a first passivation layer is arranged on the source/drain electrode of the thin film transistors, an organic transparent layer is arranged on the first passivation layer and is located in an area other than the area of the thin film transistors and the area between the adjacent two thin film transistors, post spacers are arranged on the surface of the array substrate, and is located between any two of the thin film transistors.

Wherein, the array substrate further includes a first ITO layer arranged on the organic transparent layer, the first ITO layer, the first passivation layer and the second metal layer form the storage capacitor, wherein the second metal layer is arranged in the same layer with the source/drain electrode of the thin film transistors, a first metal layer forms the scan line of the array substrate.

Wherein, the array substrate further includes a second passivation layer arranged on the first ITO layer.

Wherein, the post spacers are arranged on the second passivation layer.

Wherein, the array substrate further includes a second ITO layer arranged on the second passivation layer, the second ITO layer forms the pixel electrode.

Wherein, the pixel electrode is connected with the source/drain electrode of the thin film transistors through a via hole.

Wherein, the post spacers are arranged between the adjacent two via holes on the source/drain electrode of the thin film transistors.

Wherein, the touch metal layer and the touch insulating layer are sequentially arranged between the organic transparent layer and the first ITO layer.

Wherein, the array substrate may be a non-touch array substrate, may also be an in-cell touch array substrate.

The present disclosure provides a liquid crystal display panel, includes: a color film substrate, an array substrate, liquid crystal and post spacers sandwiched between the color film substrate and the array substrate; thin film transistors are arranged matrix on the array substrate, a first passivation layer is arranged on the source/drain electrode of the thin film transistors, an organic transparent layer is arranged on the first passivation layer and is located in an area other than the area of the thin film transistors and the area between the adjacent two thin film transistors, post spacers are arranged on the surface of the array substrate, and is located between any two of the thin film transistors.

Wherein, the array substrate further includes a first ITO layer arranged on the organic transparent layer, the first ITO layer, the first passivation layer and a second metal layer form a storage capacitor, wherein the second metal layer is arranged in the same layer with the source/drain electrode of the thin film transistors, a first metal layer forms the scan line of the array substrate.

Wherein, the array substrate further includes a second passivation layer arranged on the first ITO layer.

Wherein, the post spacers are arranged on the second passivation layer.

Wherein, the array substrate further includes a second ITO layer arranged on the second passivation layer, the second ITO layer forms the pixel electrode.

Wherein, the pixel electrode is connected with the source/drain electrode of the thin film transistors through a via hole.

Wherein, the post spacers are arranged between the adjacent two via holes on the source/drain electrode of the thin film transistors.

Wherein, a touch metal layer and a touch insulating layer are sequentially arranged between the organic transparent layer and the first ITO layer.

Wherein, the array substrate may be a non-touch array substrate, may also be an in-cell touch array substrate.

By the above method, the beneficial effects of the present disclosure is: thin film transistors are arranged matrix on the array substrate of the present disclosure, the first passivation layer is arranged on the source/drain electrode of the thin film transistors, the organic transparent layer is arranged on the first passivation layer, and is located in an area other than the area of the thin film transistors and the area between the adjacent two thin film transistors, post spacers are arranged on the surface of the array substrate, and is located between any two of the thin film transistors, can prevent the PS sliding in the hole of the organic transparent layer and increase the stability of the PS.

BRIEF DESCRIPTION OF THE DRAWINGS

In order to more clearly illustrate the embodiments or the prior art technical solutions embodiment of the present disclosure, it will implement the following figures for the cases described in the prior art or the need to use a simple introduction. Apparently, the following description the drawings are only some embodiments of the present disclosure, those of ordinary skill in speaking, without creative efforts of the premise, you can also obtain other drawings based on these drawings. Wherein.

DETAILED DESCRIPTION OF PREFERRED EMBODIMENTS

The present disclosure will now be combined with the implementation of the accompanying drawings, were clear examples of technical solutions of the present disclosure, fully described, it is clear that the described embodiments are merely part of the embodiments of the present disclosure, but not all embodiments Example. Based on the embodiments of the present disclosure, those of ordinary skill in not making all other embodiments without creative efforts obtained, are within the scope of the present disclosure is protected.

Figure 1:
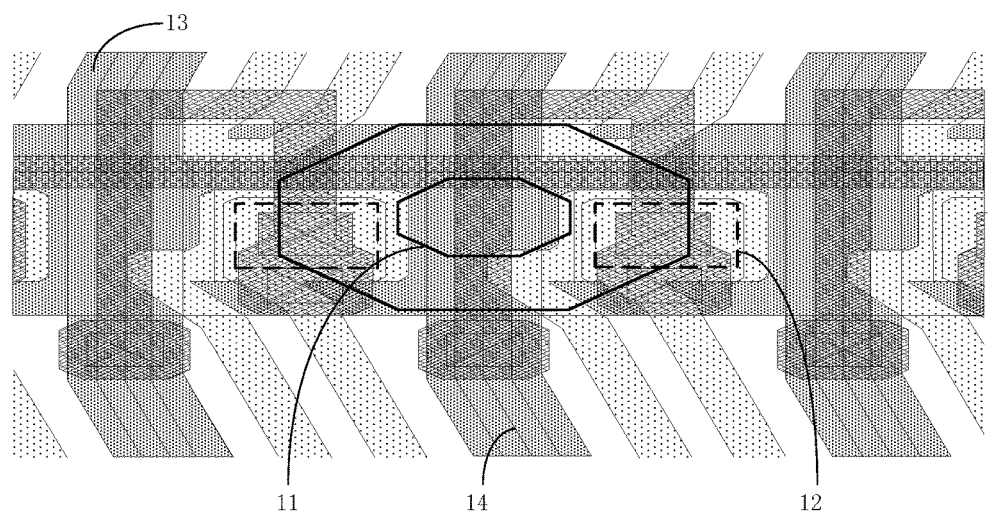
FIG. 1 is a structure schematic diagram of the liquid crystal display panel of the prior art.
Figure 2:
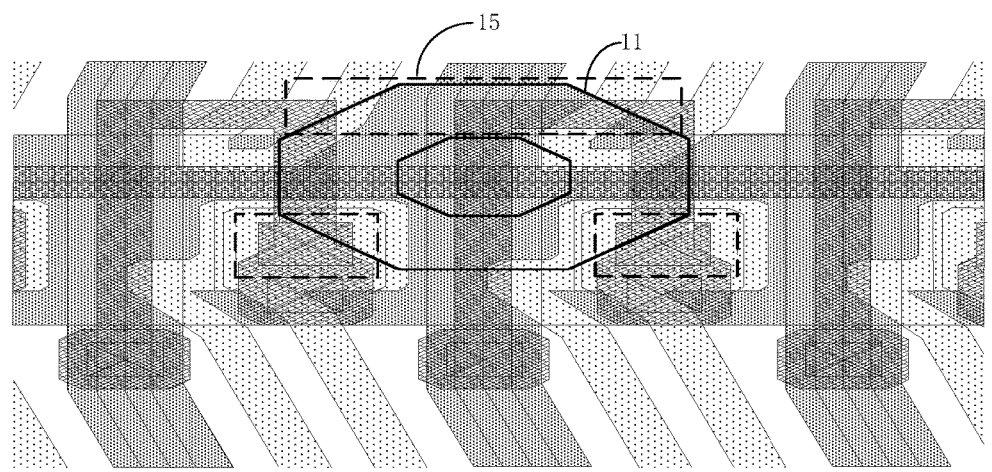
FIG. 2 is a structure schematic diagram of another liquid crystal display panel of the prior art.
Figure 3:
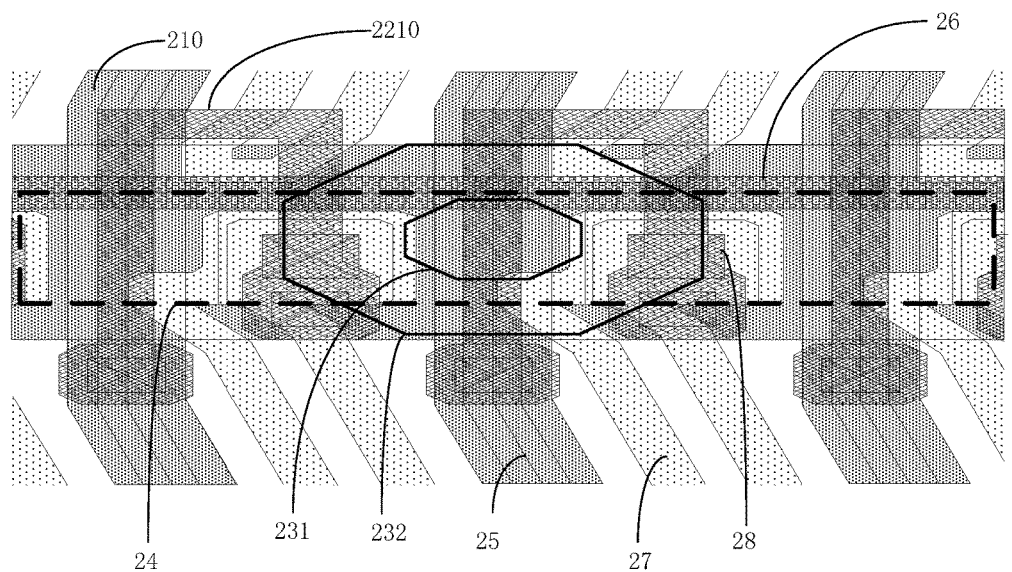
FIG. 3 is a structure schematic diagram of the liquid crystal display panel of the embodiment of the present disclosure.
Figure 4:
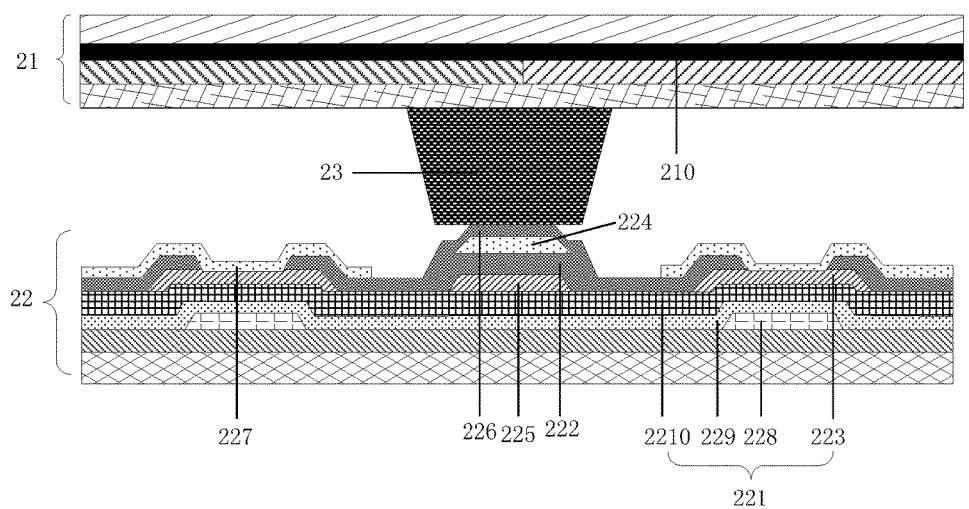
FIG. 4 is a sectional schematic diagram of the liquid crystal display panel of the embodiment of the present disclosure.

Refer to FIG. 3 and FIG. 4, FIG. 3 is a structure schematic diagram of the liquid crystal display panel of the embodiment of the present disclosure. FIG. 4 is a sectional schematic diagram corresponding to FIG. 3. The liquid crystal display panel of the embodiment of the present disclosure includes: a color film substrate 21, an array substrate 22, liquid crystal sandwiched between the color film substrate 21 and the array substrate 22 (not shown) and a post spacer 23.

Refer to FIG. 3 and FIG. 4, thin film transistors 221 are arranged matrix on the array substrate 22 of the embodiment of the present disclosure, the first passivation layer 222 is arranged on the source/drain electrode 223 of the thin film transistors 221, the organic transparent layer (not shown) is arranged on the first passivation layer 222, and is located in an area other than the area of the thin film transistors 221 and the area between the adjacent two thin film transistors 221, post spacers 23 are arranged on the surface of the array substrate 22, and is located between any two of the thin film transistors 221. In the embodiment of the present disclosure, the organic transparent layer is whole digging a hole along the gate electrode direction of the thin film transistors 221 to form a hole 24, so that when arranging the post spacer 23 between any two of the thin film transistors 221, improving the PS slide in the hole of the organic transparent layer by group the color film substrate 21 and the array substrate 22 or overlay bad, making the stability of the group of the color film substrate 21 and the array substrate 22 higher.

In the embodiment of the present disclosure, the array substrate 22 further includes a first ITO layer 224 arranged on the organic transparent layer. The organic transparent layer is whole digging a hole along the thin film transistor 221 in the area of the thin film transistor 221 and the area between adjacent two thin film transistors 221 and the first ITO layer 224 is directly arranged on the second metal layer 225 in the area. The first ITO layer 224, the first passivation layer 222 and the second metal layer 225 form the storage capacitor. Wherein, the second metal layer 225 and the source/drain electrode of the thin film transistor 221 are arranged in the same layer, and forming the data line 25, the first metal layer is formed the scan line 26 of the array substrate 22.

The array substrate 22 further includes the second passivation layer 226 arranged on the first ITO layer 224. The PS 23 is arranged on the second passivation layer 226. The array substrate 22 further includes the second ITO layer 227 arranged on the second passivation layer 226, the second ITO layer 227 forms the pixel electrode 27. The pixel electrode 27 is connected with the source/drain electrode 223 of the thin film transistor 221 through a via hole 28.

In the embodiment of the present disclosure, the gate electrode of the thin film transistor 221 is formed by a polysilicon layer 228, between the polysilicon layer 228 and the source/drain electrode 223 further arranged the gate insulating layer 229 and the dielectric layer 2210.

In the embodiment of the present disclosure, the array substrate 22 may be a non-touch array substrate, refer to FIG. 3 and FIG. 4; may also be an in-cell touch array substrate. In the in-cell touch array substrate, between the organic transparent layer and the first ITO layer sequentially arranged the touch metal layer and touch insulating layer, other structure is as same as the non-touch array substrate structure, not discussed here. It should be noted, the non-touch array substrate may be applied to a non-touch liquid crystal display panel, may also be applied to a liquid crystal display panel additionally provided with the touch panel.

In the liquid crystal display panel of the embodiment of the present disclosure, arranging the black matrix 210 at the position corresponding to the post spacer 23 in the color film substrate 21 to block the dark line caused the liquid crystal disorder by the poor alignment. In addition, the position corresponding to the scan line 26 and the data line 25 is further arranged the black matrix 210.

In the embodiment of the present disclosure, the upper and lower bottom surface of the post spacer 23 is hexagon, side of the post spacer 23 is trapezoid structure. The post spacer 23 is arranged between the adjacent two via holes 28 on the source/drain electrode 223 of the thin film transistor 221. I.e. the surface 231 of the post spacer 23 contacted with the array substrate 22 is between the adjacent two via holes 28 on the source/drain electrode 223 of the thin film transistor 221. Can be seen from FIG. 3, the surface 232 of the post spacer 23 contacted with the color film substrate 21 without departing from the scope of the black matrix 210 covered, description the designed post spacer 23 does not affect the aperture ratio.

In summary, the present disclosure has thin film transistor arranged on the array substrate, the first passivation layer is arranged on the source/drain electrode of the thin film transistor, the organic transparent layer is arranged on the first passivation layer and is located in an area other than the area of the thin film transistors and the area between the adjacent two thin film transistors, post spacers are arranged on the surface of the array substrate, and is located between any two of the thin film transistors, can prevent the PS sliding in the hole of the organic transparent layer, it is possible to increase the stability of the PS.

Above are only embodiments of the present disclosure is not patented and therefore limit the scope of the disclosure, all the contents of the present disclosure utilize the specification made equivalent structures or equivalent process transformation, either directly or indirectly related technologies used in other areas are included in the patent empathy scope of the disclosure.

What is claimed is:

1. An array substrate, wherein, thin film transistors are arranged matrix on the array substrate, a first passivation layer is arranged on the source/drain electrode of the thin film transistors, an organic transparent layer is arranged on the first passivation layer and is located in an area other than the area of the thin film transistors and the area between the adjacent two thin film transistors, post spacers are arranged on the surface of the array substrate, and is located between any two of the thin film transistors; wherein the organic transparent layer is wholly digging a hole along the gate electrode direction of the thin film transistors to form the hole.

2. The array substrate according to claim 1, wherein, the array substrate further comprises a first ITO layer, a first metal layer and a second metal layer, wherein the first ITO layer is arranged on the organic transparent layer, the first ITO layer, the first passivation layer and the second metal layer to form a storage capacitor, wherein the second metal layer is arranged in the same layer with the source/drain electrode of the thin film transistors, the first metal layer forms the scan line of the array substrate.

3. The array substrate according to claim 2, wherein, the array substrate further comprises a second passivation layer arranged on the first ITO layer.

4. The array substrate according to claim 3, wherein, the post spacers are arranged on the second passivation layer.

5. The array substrate according to claim 3, wherein, the array substrate further comprises a second ITO layer arranged on the second passivation layer, the second ITO layer forms a pixel electrode.

6. The array substrate according to claim 5, wherein, the pixel electrode is connected with the source/drain electrode of the thin film transistors through a via hole.

7. The array substrate according to claim 6, wherein, the post spacers are arranged between the adjacent two via holes on the source/drain electrode of the thin film transistors.

8. The array substrate according to claim 2, wherein, a touch metal layer and a touch insulating layer are sequentially arranged between the organic transparent layer and the first ITO layer.

9. The array substrate according to claim 1, wherein, the array substrate is at least one of a non-touch array substrate and an in-cell touch array substrate.

10. A liquid crystal display panel, wherein, the liquid crystal display panel comprises: a color film substrate, an array substrate, liquid crystal and post spacers sandwiched between the color film substrate and the array substrate; thin film transistors are arranged matrix on the array substrate, a first passivation layer is arranged on the source/drain electrode of the thin film transistors, an organic transparent layer is arranged on the first passivation layer and is located in an area other than the area of the thin film transistors and the area between the adjacent two thin film transistors, post spacers are arranged on the surface of the array substrate, and is located between any two of the thin film transistors; wherein the organic transparent layer is wholly digging a hole along the gate electrode direction of the thin film transistors to form the hole.

11. The liquid crystal display panel according to claim 10, wherein, the array substrate further comprises a first ITO layer, a first metal layer and a second metal layer, wherein the first ITO layer is arranged on the organic transparent layer, the first ITO layer, the first passivation layer and the second metal layer to form a storage capacitor, wherein the second metal layer is arranged in the same layer with the source/drain electrode of the thin film transistors, the first metal layer forms the scan line of the array substrate.

12. The liquid crystal display panel according to claim 11, wherein, the array substrate further comprises a second passivation layer arranged on the first ITO layer.

13. The liquid crystal display panel according to claim 12, wherein, the post spacers are arranged on the second passivation layer.

14. The liquid crystal display panel according to claim 12, wherein, the array substrate further comprises a second ITO layer arranged on the second passivation layer, the second ITO layer forms a pixel electrode.

15. The liquid crystal display panel according to claim 14, wherein, the pixel electrode is connected with the source/drain electrode of the thin film transistors through a via hole.

16. The liquid crystal display panel according to claim 15, wherein, the post spacers are arranged between the adjacent two via holes on the source/drain electrode of the thin film transistors.

17. The liquid crystal display panel according to claim 11, wherein, a touch metal layer and a touch insulating layer are sequentially arranged between the organic transparent layer and the first ITO layer.

18. The liquid crystal display panel according to claim 10, wherein, the array substrate is at least one of a non-touch array substrate and an in-cell touch array substrate.

* * * * *